United States Patent
Diemunsch

Patent Number: 6,094,345
Date of Patent: Jul. 25, 2000

[54] COMPONENT COOLING ARRANGEMENT IN ELECTRONIC EQUIPMENT WITH INTERNAL POWER SUPPLY

[75] Inventor: Guy Diemunsch, St Egrève, France

[73] Assignee: Hewlett-Packard Company, Palo Alto, Calif.

[21] Appl. No.: 08/845,596

[22] Filed: Apr. 25, 1997

[30] Foreign Application Priority Data

May 14, 1996 [EP] European Pat. Off. .............. 96410050

[51] Int. Cl.⁷ ..................................................... H05K 7/20
[52] U.S. Cl. .......................... 361/695; 361/687; 361/688; 361/690; 361/691; 361/692; 361/693; 361/694; 361/695; 361/696; 361/697; 361/720; 361/809; 307/150; 174/16.1; 165/80.3
[58] Field of Search ..................................... 361/695, 683, 361/684, 687, 689, 690–699, 700–721, 818–836; 312/236; 165/80.3, 80.4, 185, 104.33; 174/16.3

[56] References Cited

U.S. PATENT DOCUMENTS

| | | | |
|---|---|---|---|
| 5,424,915 | 6/1995 | Katooka et al. ........................ | 361/695 |
| 5,440,450 | 8/1995 | Lau . | |
| 5,523,917 | 6/1996 | Searby ..................................... | 361/687 |
| 5,691,883 | 11/1997 | Nelson ..................................... | 361/697 |

FOREIGN PATENT DOCUMENTS

| | | |
|---|---|---|
| 0460415 | 12/1991 | European Pat. Off. . |
| 9601035 | 1/1996 | WIPO . |

OTHER PUBLICATIONS

Patent Abstracts of Japan vol. 013, No. 142 (E–739), Apr. 7, 1989 & JP–A–63 302736 (Fuji Electric Co Ltd), Dec. 9, 1988 *abstract*.
Patent Abstracts of Japan vol. 014, No. 041 (E–0879), Jan. 25, 1990 & JP–A–01 273395 (NEC Corp), Nov. 1, 1989 *abstract*.
IBM Technical Disclosure Bulletin, vol. 25, No. 7b, Dec. 1982, New York US, pp. 3906–3908, XP002018366 "Induced Cooling in a Unit Cooling Scheme" *the whole document*.

Primary Examiner—Leo P. Picard
Assistant Examiner—Michael Datskovsky

[57] ABSTRACT

In a modern computer, heat is removed from the internal power supply unit by means of a fan and ducting for channeling the airflow created by the fan through the circuitry of the power supply unit. The fan draws part of its air supply from the ambient air inside the computer casing and this helps to cool other components of the computer such as the microprocessor. As the power of microprocessors increases, the cooling requirement for this component has increased and heat sinks have been utilised to increase heat transfer to the surrounding air. Whilst further augmentation of heat removal could be achieved by increasing the power of the cooling fan, this would also increase noise levels. The present arrangement provides for increased heat removal without increasing fan power by arranging for the microprocessor heat sink to project into the ducting used to channel cooling air over the circuitry of the power supply unit.

7 Claims, 3 Drawing Sheets

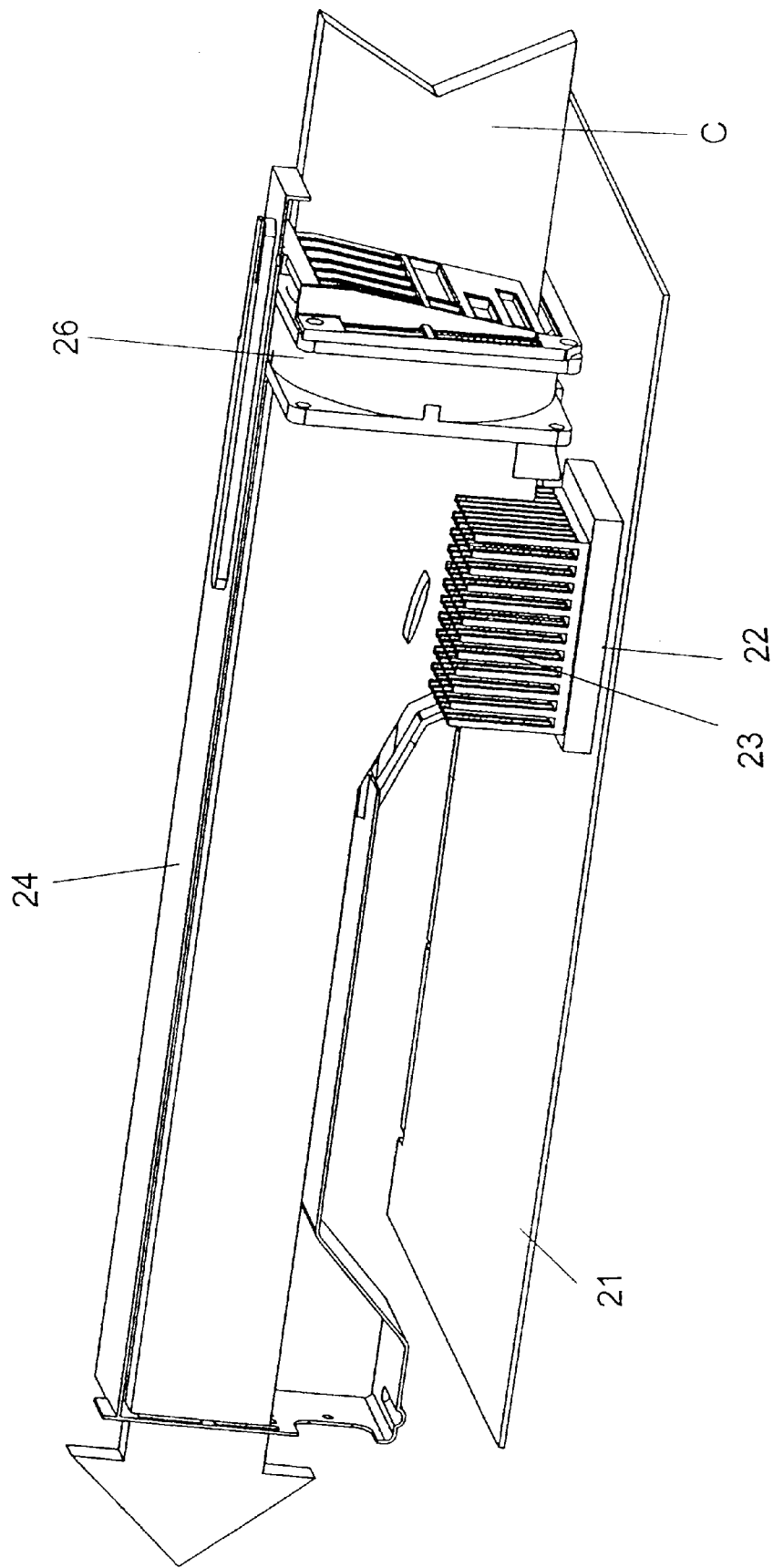

COMPONENT COOLING ARRANGEMENT IN ELECTRONIC EQUIPMENT WITH INTERNAL POWER SUPPLY

FIELD OF THE INVENTION

The present invention relates to the cooling of a component in electonic equipment that has an internal power supply with forced cooling. In particular, but not exclusively, the present invention relates to a microprocessor cooling arrangement for a computer such as a server or desktop computer.

BACKGROUND OF THE INVENTION

FIG. 1 of the accompanying drawings shows, in highly diagrammatic form, certain major components of a typical desktop computer. In particular, within the casing 10 of the computer are shown the main printed circuit board 11 (motherboard) and the power supply unit 14; other major components such as storage devices have been omitted for clarity.

The motherboard 11 mounts a microprocessor chip 12, either directly (for example, by surface mounting) or by means of a socket. Modern microprocessor devices dissipate a substantial amount of heat during normal operation and typically operate at working temperatures of 70 to 85 degrees centigrade. For this reason it is often necessary with the more powerful microprocessors to take special measures to remove the dissipated heat. For example, and as depicted in FIG. 1, a heat sink 13 may be mounted on top of the microprocessor chip 12 in good thermal contact with it. Typically the heat sink comprises an array of fins (only diagrammatically indicated in FIG. 1); these fins facilitate the transfer of heat to the internal ambient air.

Of course, the main source of heat within a desktop computer as in most items of electronic equipment, is the power supply unit 14. In order to provide cooling to this unit, it is enclosed in a casing 15 that not only provides a safety barrier for high voltage protection, but also serves as a ducting through which a strong airflow can be passed to cool the electronic components of the unit 14. This air flow is created by a fan 16 located at one end of the ducting 15 and normally forming one subassembly together with the power supply unit 14. The fan 16 draws in air from internally of the computer casing 10 (this airflow is represented by arrows A in FIG. 1 and enters the fan through slot 17) and possibly also from externally of the casing 10 (airflow B). The air drawn in by the fan 16 is then forced through the ducting 15 and out of the casing 10 through external slot 18.

The reason for drawing in air through slot 17 from internally of the casing is that the resultant airflow A across the motherboard 11 facilitates the cooling of the components mounted on the motherboard 11 such as the microprocessor chip 12. However, the intensity of this airflow is much less than that passing through the ducting 15.

As the power of microprocessors continues to increase, the problem of dissipating the heat generated becomes more significant. One possible solution would be to use a more powerful fan and thereby increase the airflow past the microprocessor and its heat sink. However, this would result in a increase in noise level both from the fan itself and from the stronger airflow.

It is an object of the present invention to provide a convenient and cost effective way of improving heat removal from microprocessor and similar electronic components which does not require the use of a more powerful fan.

SUMMARY OF THE INVENTION

In accordance with the present invention, increased heat removal from the microprocessor (or other component) is achieved by arranging for the heat sink of the microprocessor to project into the ducting used to channel cooling air through the power supply unit.

More formally and more generally stated, according to the present invention, there is provided electronic equipment including:

a power supply assembly comprising power-supply circuitry and air-flow ducting encasing the power-supply circuitry, a fan for creating an air flow through said air-flow ducting to cool the power-supply circuitry, and a circuit board mounting a component provided with a heat sink; wherein said power supply assembly extends across said circuit board and overlies the component provided with a heat sink, the ducting being formed with an aperture facing the component provided with a heat sink and at least a portion of the heat sink projecting through the aperture into the ducting to be cooled by air flowing therethrough.

In one preferred embodiment, only the heat sink (or a portion of it) projects into the ducting whereas in another embodiment, the circuit board itself extends into the ducting such that the component with its heat sink is disposed therewithin.

Although for simplicity the ducting will generally only define a single internal airflow path, it would be possible to provide an internal partition dividing the air flow into first and second streams that respectively pass over the power supply circuitry and over the heat sink.

According to another aspect of the present invention, there is provided a power supply assembly for electronic equipment, the assembly comprising power supply circuitry and ducting surrounding this circuitry for channeling an air flow therepast, the ducting including means for mounting a fan at one end to cause said air flow and being formed with an aperture through which a heat sink can project into the ducting.

BRIEF DESCRIPTION OF THE DRAWINGS

A microprocessor cooling arrangement embodying the invention will now be described, by way of non-limiting example, with reference to the accompanying diagrammatic drawings, in which:

FIG. 3 is a cut-away view of the FIG. 2 ducting showing the airflow therethrough.

BEST MODE OF CARRYING OUT THE INVENTION

According to the preferred embodiment of the present invention, increased cooling of the microprocessor of a desktop computer is achieved by arranging for a heat sink of the microprocessor to project into the air flow channeled through the computer power supply unit by the casing of that unit.

Figure 1:
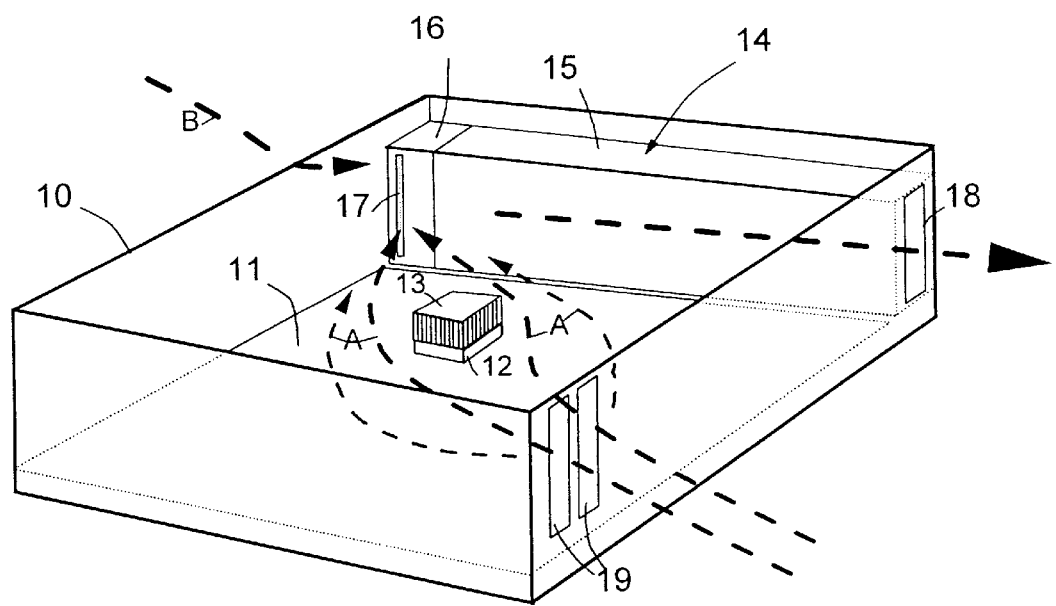
FIG. 1 is a diagram of a prior cooling arrangement for a desktop computer.

Thus, in terms of the prior art arrangement of FIG. 1, the power supply unit 14 is arranged to overlie the microprocessor 12 and the heat sink 13 projects up through an aperture in the ducting 15 to be cooled by the airflow created by the fan 16 through the ducting. This arrangement does, of course, require repositioning of the microprocessor on the motherboard 11 and/or relocation of the power supply unit in the casing 10 as compared to their FIG. 1 dispositions.

Figure 2:
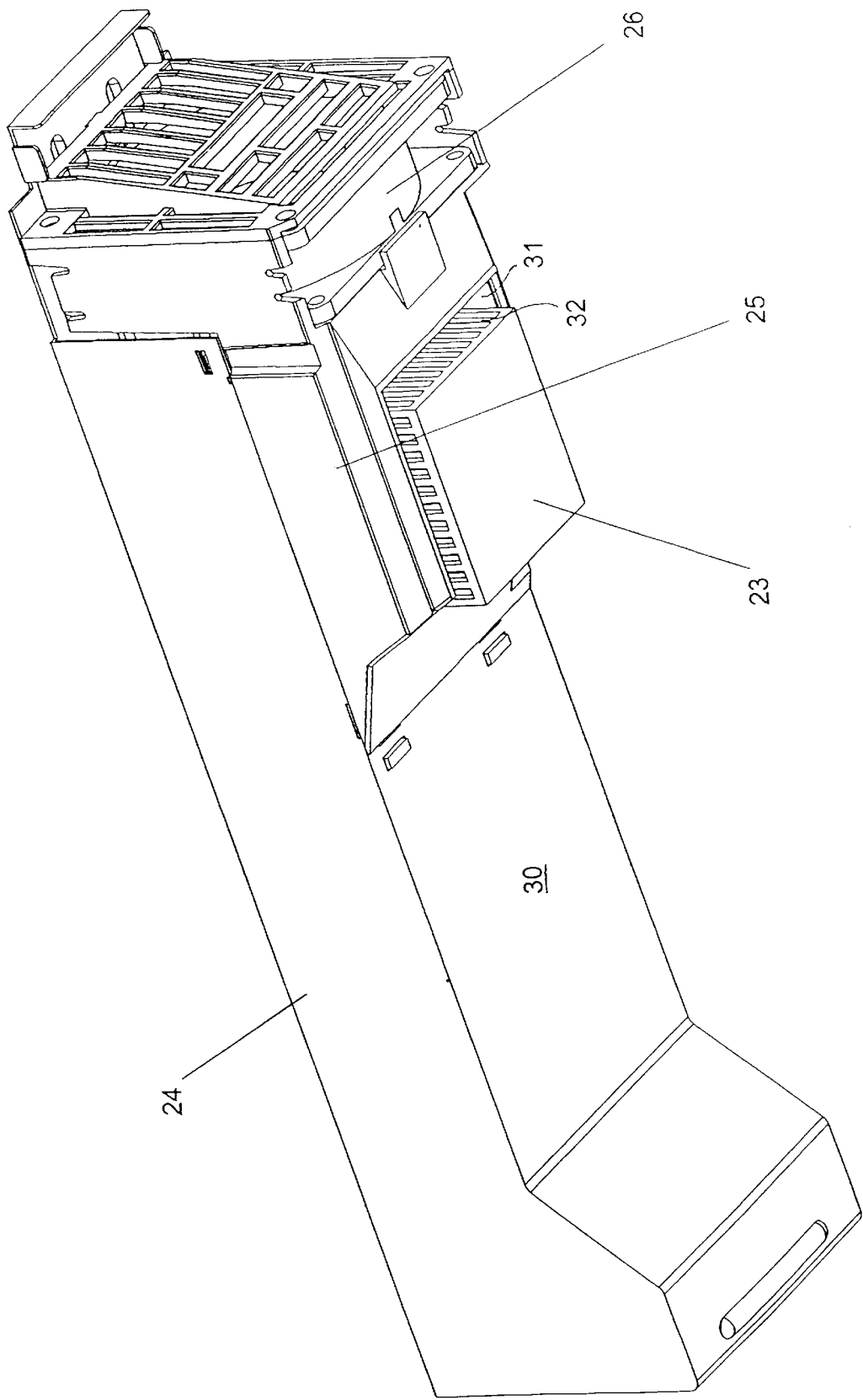
FIG. 2 is an external view of a power supply unit adapted to implement the microprocessor cooling arrangement embodying the present invention, this Figure showing the insertion of a microprocessor heat sink into an aperture of airflow ducting forming the external casing of the power supply unit.

FIG. 2 is an underside perspective view of a power supply unit 24 embodying the present invention showing the external casing 25 that serves as airflow ducting for channeling the airflow created by fan 26 through the power supply circuitry (not visible in FIG. 2) housed in portion 30 of the ducting 25. The ducting 25 is formed with an aperture 31 sized to receive a microprocessor heat sink 23 such that the fins 32 of this heat sink lie in the path of the airflow channeled through the ducting 25.

As is illustrated in FIG. 3, the heat sink 23 is attached to a microprocessor 22 to be cooled, this microprocessor being mounted on motherboard 21. The airflow through the ducting 25 is depicted in FIG. 3 by the large arrow C.

It will be appreciated that the arrangement illustrated in FIGS. 2 and 3 is simple to implement yet significantly enhances heat removal from the microprocessor 22 due to the much stronger flow of air through the ducting 25 as compared to the airflow past the microprocessor 12 in FIG. 1. Furthermore, this enhanced heat removal is achieved without the use of a more powerful fan that would increase noise levels. In addition, the present arrangement avoids any significant increase in ambient temperature within the computer casing that might cause a problem for other components or sub-assemblies, such as the hard disc drive.

From an alternative viewpoint, the present arrangement enables the size of the heat sink to be kept down whilst providing for increased heat removal.

Of course, various modifications can be made to the described microprocessor cooling arrangement. Thus, for example, rather than having only the heat sink 23 project into the ducting 25, it would be possible to dispose the whole of the relevant portion of the motherboard within the ducting, though this is not preferred since the simplest way of doing this is to position the microprocessor adjacent an edge of the motherboard which then makes track layout problematic. Another possible modification would be to provide an internal partition in ducting 25 dividing the air flow into first and second streams that respectively pass over the power supply circuitry and over the heat sink (in the arrangement of FIGS. 2 and 3, the portion of the airflow passing through the fins of the heat sink 23, also passes over the power supply circuitry). The use of an internal partition can result in increased noise levels so this approach may not be acceptable in all cases.

It will be appreciated that the described microprocessor cooling arrangement can be used in other items of electronic equipment as well as in desktop computers. Furthermore, the general arrangement can be used to cool other types of electronic components (such as power transistors and power diodes) that represent "hot points" of circuit boards normally disposed outside of the power supply cooling ducting; for example, as multimedia applications play a greater and greater role in computing, it may be expected that sound boards will become increasingly powerful so that the active output stages of these boards will present "hot points" requiring particular cooling. It will be further appreciated that the heat sink of the component to be cooled can be formed either as a separate element and subsequently placed in good thermal contact with the component concerned, or as an integral part of the component itself (for example, as integral fins on the casing of a power transistor). In fact, the described arrangement could even be used in relation to components not provided with a heat sink by arranging for the component itself to lie at least partially within the airflow ducting of the power supply unit; however, this will generally not provide sufficient benefit by itself to be of much practical interest in most situations.

What is claimed is:

1. Electronic equipment including:

a power supply assembly comprising power-supply circuitry and air-flow ducting encasing the power-supply circuitry, a fan for creating an air flow through said air-flow ducting to cool said power-supply circuitry, and a circuit board distinct from the power supply assembly and mounting functional circuitry, said functional circuitry being powered from the power supply and including a component provided with a heat sink, said power supply assembly extending across said circuit board and overlying said component provided with a heat sink, said ducting having an aperture facing the component provided with a heat sink and at least a portion of said heat sink projecting through said aperture into the ducting whereby the component is cooled by air flowing therethrough.

2. Electronic equipment according to claim 1, wherein said equipment is a computer and said component is a microprocessor.

3. Electronic equipment according to claim 1, wherein said circuit board extends into said ducting such that said component with its heat sink is disposed therewithin.

4. Electronic equipment according to claim 1, wherein said ducting includes an internal partition dividing said air flow into first and second streams that respectively pass over said power-supply circuitry and over said heat sink.

5. A power supply assembly for electronic equipment, said assembly comprising power supply circuitry and ducting surrounding said circuitry for channeling an air flow therepast, said ducting including means for mounting a fan at one end to cause said air flow and being formed with an external aperture through which a heat sink distinct from the power supply circuitry projects into the ducting to permit said airflow to flow thereacross.

6. In combination, the power supply assembly of claim 5 and a fan mounted on said means for mounting.

7. A method of cooling a electronic component mounted on a circuit board comprising the steps of:

providing the component with a heat sink, providing a power supply assembly having power supply circuitry and air flow ducting with an aperture therein, providing a fan for creating air flow through said air flow ducting to cool said power supply circuitry, disposing said power supply assembly and said fan adjacent said circuit board and connecting said power supply circuitry to power components mounted on said circuit board, said power supply assembly, when disposed adjacent said circuit board, extending across said circuit board and overlying said electronic component with said aperture facing the component and at least a portion of said heat sink projecting through said aperture into the ducting, and causing said fan generate air flow whereby the electronic component is cooled by air flowing through the fan and through the air flow ducting.

* * * * *